US009335351B2

(12) United States Patent
Spooner (10) Patent No.: US 9,335,351 B2
(45) Date of Patent: May 10, 2016

(54) TRACKING POWER OUTAGES UTILIZING AN ELECTRONIC DEVICE

(75) Inventor: Steven J. Spooner, Castle Rock, CO (US)

(73) Assignee: ECHOSTAR TECHNOLOGIES L.L.C., Englewood, CO (US)

( * ) Notice: Subject to any disclaimer, the term of this patent is extended or adjusted under 35 U.S.C. 154(b) by 463 days.

(21) Appl. No.: 12/979,956

(22) Filed: Dec. 28, 2010

(65) Prior Publication Data

US 2012/0161752 A1    Jun. 28, 2012

(51) Int. Cl.
*G01R 7/00* (2006.01)
*G01R 11/32* (2006.01)
*G01R 19/25* (2006.01)

(52) U.S. Cl.
CPC .................................. *G01R 19/2513* (2013.01)

(58) Field of Classification Search
CPC ................................ G01R 22/00; G01R 35/04
USPC .................... 324/142, 140, 702; 340/635, 654
See application file for complete search history.

(56) References Cited

U.S. PATENT DOCUMENTS

| | | | | |
|---|---|---|---|---|
| 4,138,697 A * | 2/1979 | Russillo et al. | | 360/6 |
| 4,466,074 A * | 8/1984 | Jindrick et al. | | 702/176 |
| 4,987,363 A * | 1/1991 | Gibbs et al. | | 324/142 |
| 4,999,575 A * | 3/1991 | Germer | | 324/142 |
| 5,663,711 A * | 9/1997 | Sanders | | G08B 21/185 340/635 |
| 5,790,431 A * | 8/1998 | Ahrens et al. | | 718/104 |
| 6,026,495 A * | 2/2000 | Lacombe et al. | | 713/340 |
| 6,219,655 B1 * | 4/2001 | Schleich et al. | | 705/412 |
| 6,229,450 B1 * | 5/2001 | Malmsten | | 340/652 |
| 6,711,908 B2 * | 3/2004 | Ferragut et al. | | 62/129 |
| 6,965,224 B1 * | 11/2005 | Hey | | 324/76.53 |
| 7,009,514 B2 * | 3/2006 | Dupeire | | H02G 1/00 340/568.4 |
| 8,880,281 B2 * | 11/2014 | Giles | | G07C 5/085 701/29.1 |
| 2004/0021577 A1 * | 2/2004 | Lelecas | | 340/654 |
| 2006/0200774 A1 * | 9/2006 | Flam et al. | | 715/764 |
| 2006/0202672 A1 * | 9/2006 | Wood | | 324/76.11 |
| 2009/0248214 A1 * | 10/2009 | Fickey et al. | | 700/286 |
| 2009/0273713 A1 * | 11/2009 | Goldman et al. | | 348/563 |
| 2009/0276650 A1 * | 11/2009 | Kuroda et al. | | 713/320 |

OTHER PUBLICATIONS

IPCOM000099872D, Barker et al., "Setting Current Status Values", Mar. 15, 2005, p. 338-339.*

* cited by examiner

*Primary Examiner* — Tung X Nguyen
*Assistant Examiner* — Giovanni Astacio-Oquendo
(74) *Attorney, Agent, or Firm* — Kilpatrick Townsend & Stockton LLP (57) ABSTRACT

An electronic device records a first time and then a second time, each when connected to an AC power source. After the electronic device records the first and second times, the electronic device calculates a difference by subtracting the second time from the first and determines a power outage occurred by verifying that the difference is greater than a threshold. After determining that a power outage occurred, the electronic device may display one or more messages regarding the determined power outage either automatically or in response to user input received from the user input device. In some implementations, the first and second time may be part of a sequence of times that the electronic device regularly records at fixed interval of electronic device operation. In other implementations, the first time may be regularly recorded and the second time may be recorded upon the occurrence of an event.

20 Claims, 5 Drawing Sheets

TRACKING POWER OUTAGES UTILIZING AN ELECTRONIC DEVICE

FIELD OF THE INVENTION

This disclosure relates generally to power outages, and more specifically to utilizing electronic devices to monitor the occurrence and/or duration of power outages.

SUMMARY

The present disclosure discloses systems and methods for tracking power outages utilizing an electronic device. An electronic device may record a first time when connected to an AC power source and then a second time when connected to the AC power source. The first and second time may be recorded based on a time signal received from a time signal source, an internal clock, an internal clock that is synchronized based on a time signal received from a time signal source, and so on. After the electronic device records the first and second times, the electronic device may calculate a time difference by subtracting the second time from the first time. The electronic device may determine a power outage of a duration corresponding to the time difference occurred by verifying that the time difference is greater than a threshold value. After determining that a power outage occurred, the electronic device may display one or more messages regarding the determined power outage. Such a message may include a notification that a power outage has occurred, a duration of the power outage (which may be an estimate), a time that the power outage occurred (which may be an estimate), and so on. Further, messages may be displayed automatically, in response to user input received from the user input device, and so on.

In some implementations, the first and second time may be part of a sequence of times that the electronic device regularly records at fixed interval of electronic device operation (such as a processor clock signal). In other implementations, the first time may be regularly recorded and the second time may be recorded by the electronic device upon the occurrence of an event such as reconnection to the AC power source, reboot of the electronic device, and so on.

In various implementations, the electronic device may include one or more timers that automatically trigger performance of one or more operations, such as timers for a content receiver to automatically record content. In such implementations, after determining that a power outage occurred, the electronic device may ascertain whether one or more operations associated with such timers was not performed, and either automatically perform the operations that were not performed or display information regarding the operations that were not performed and perform the operations in response to receiving user input.

It is to be understood that both the foregoing general description and the following detailed description are for purposes of example and explanation and do not necessarily limit the present disclosure. The accompanying drawings, which are incorporated in and constitute a part of the specification, illustrate subject matter of the disclosure. Together, the descriptions and the drawings serve to explain the principles of the disclosure.

DETAILED DESCRIPTION OF THE EMBODIMENTS

The description that follows includes sample systems, methods, and computer program products that embody various elements of the present disclosure. However, it should be understood that the described disclosure may be practiced in a variety of forms in addition to those described herein.

Electronic devices are ubiquitous in modern life. Such electronic devices include computing devices, televisions, electronic kitchen appliances, lighting, heating and air conditioning systems, video game systems, battery charging devices, television receivers, set top boxes, electronic clocks, digital video recorders, digital video disc players, digital music players, entertainment systems, factory machinery, and so on. While some electronic devices are powered by battery power, most electronic devices are powered (at least for some portion of their operating time) by an alternating current (AC) power source. Such an AC power source may be an electricity provider company, such as a municipal and/or private utility company, which provides electricity to homes, businesses, and so on.

Unfortunately, such AC power sources are not completely reliable and do not provide AC power constantly. Though more frequent in some areas than others, brownouts, blackouts, and other AC power source disruptions are common to all AC power sources. Some electronic devices reset after a power outage and display one or more indicators that a power outage has occurred. One example of this is an electronic clock that flashes "12:00" after a power outage, alerting a user that a power outage has occurred and that the time on the electronic clock needs to be reconfigured.

However, even though a user is able to tell from such indicators as a flashing "12:00" that a power outage has occurred, a user may be unable to ascertain the exact duration of the power outage. The power outage may have only lasted a few seconds, but may have also lasted several hours, days, or even longer. A user may need to know that AC power was not being provided for a certain period of time, such as for the purpose of determining whether or not food in a refrigerator is safe to eat, whether or not content scheduled for automatic recording by a digital video recorder were automatically recorded, whether or not water pipes may have frozen due to a lack of heating, and so on. A user who is aware that a power outage has occurred may resort to questioning neighbors, but may ultimately be unable to determine the exact duration of a particular power outage and may thus be unable to efficiently take appropriate steps regarding dangerous food, unrecorded programs, frozen pipes, and so on.

The present disclosure discloses systems and methods for tracking power outages utilizing an electronic device. An electronic device may record a first time when the electronic device is connected to an AC power source. Then, the electronic device may record a second time when the electronic device is connected to the AC power source. The first and second time may be recorded based on a time signal received from a time signal source, an internal clock, an internal clock that is synchronized based on a time signal received from a time signal source, and so on. The first and second time may be part of a sequence of times that the electronic device regularly records at fixed interval of electronic device operation (such as a processor clock signal). Alternatively, the first time may be regularly recorded and the second time may be recorded by the electronic device upon the occurrence of an event such as reconnection to the AC power source, reboot of the electronic device, and so on. After the electronic device records the first and second times, the electronic device may calculate a time difference by subtracting the second time from the first time. The electronic device may determine a power outage of a duration corresponding to the time difference occurred by verifying that the time difference is greater than a threshold value.

Figure 1:
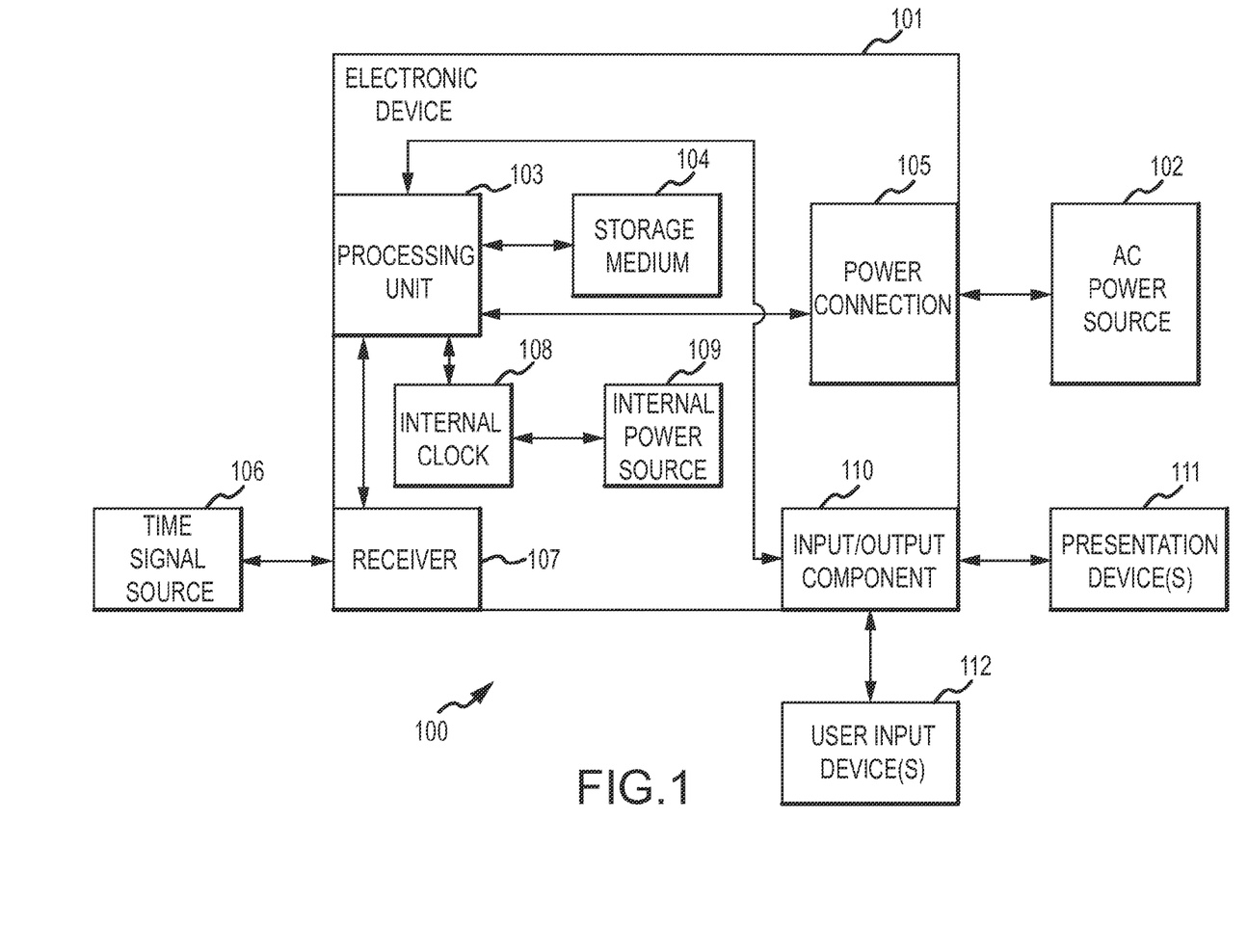
FIG. 1 is a block diagram illustrating a system for tracking power outages utilizing an electronic device.

FIG. 1 is a block diagram illustrating a system 100 for tracking power outages utilizing an electronic device. The system 100 includes an AC power source 102 and a electronic device 101, which may be any kind of electronic device such as a computing device, a television, an electronic kitchen appliance, a lighting device, a heating and/or air conditioning system, a video game system, a battery charging device, a television receiver, a set top box, an electronic clock, a video recorder, a digital video recorder, a digital video disc player, a music player, a digital music player, an entertainment system, a piece of factory machinery, and so on. The electronic device may include one or more processing units 103, or more power connections 105 to the AC power source, and one or more non-transitory storage media 104 (which may take the form of, but is not limited to, a magnetic storage medium; optical storage medium; magneto-optical storage medium; read only memory; random access memory; erasable programmable memory; flash memory; and so on). The processing unit 103 may execute instructions stored in the non-transitory storage medium 104 to perform one or more electronic device operating functions.

The processing unit 103 may also execute instructions stored in the non-transitory storage medium 104 to track one or more power outages. As such, the processing unit may record in the non-transitory storage medium (which may be a nonvolatile storage medium) a first time when the power connection 105 is connected to the AC power source 102 and a second time when the power connection is connected to the AC power source. The processing unit may then calculate a time difference by subtracting the second time from the first time and may determine a power outage of a duration corresponding to the time difference occurred by verifying that the time difference is greater than a threshold value (which may also be stored in the non-transitory storage medium). The processing unit may also record information regarding the power outage, such as the duration of the power outage, in the non-transitory storage medium. The threshold value may correspond to a period of time for which a power outage is negligible and a user may not need to be aware about, such as several seconds or a few minutes.

In some implementations, the electronic device may include a receiver 107 for receiving a time signal from a time signal source 106 (such as a network and/or satellite time signal, a time signal radio transmitter such as those maintained by the United States government, and so on) and/or an internal clock 108 that may be powered by an internal power source 109 (such as one or more batteries). In such implementations, the processing unit 103 may record the first and second time based on the time signal received from the time signal source or the internal clock. Additionally, in implementations where the processing unit 103 records the first and second time based on the internal clock, the processing unit may regularly (and/or periodically) synchronize the internal clock based on the time signal received via the receiver from the time signal source.

In various implementations, the processing unit 103 may record the first and second times as part of a regularly recorded sequence of times that the processing unit records (such as in a number of nonvolatile registers) at a fixed interval of electronic device 101 operation. For example, the processing unit may record a time each time a certain number of clock cycles elapses (such as one thousand). The processing unit may retain storage of a certain number of the previously stored times for purposes of compression, such as two, five, or ten. As such, the first and second time may be the last two stored times. However, in various other implementations, the first time may be a time that the processing unit regularly records (such as every two thousand clock cycles) and the second time may be a time the processing unit records upon the occurrence of one or more events, such as reconnection of the power connection 105 to the AC power source 102 after a period of disconnection, reboot of the electronic device 101, and so on. In these other implementations, the processing unit may perform operations to prevent a false determination of a power outage occurred. For example, in implementations where the second time is recorded upon reboot, the processing unit may overwrite the recorded first time with a null value when a user hard powers down the electronic device. Thus, when the second time is recorded upon reboot, the processing unit may detect that the first time is null and not determine that a power outage occurred as the time difference would be due to the user hard powering down the electronic device instead of a power outage.

The electronic device 101 may also include one or more input/output components which may interact with one or more presentation devices 111 (such as one or more computer monitors, liquid crystal display screens, televisions, cathode ray tube displays, speakers, printers, and so on) and/or one or more user input devices 112 (such as one or more keyboards, keypads, touch screens, track pads, virtual keyboards, microphones, and so on). In various implementations, when the processing unit 103 determines that a power outage occurred, the processing unit may transmit one or more messages regarding the determined power outage to the presentations device via the input/output component. Such a message may include a notification that a power outage has occurred, a duration of the power outage (which may be an estimate), a time that the power outage occurred (which may be an estimate), and so on. Further, the processing unit may transmit the messages automatically such that the messages may function as automatic pop-up notifications for a user regarding the power outage. Additionally, the processing unit may transmit the messages in response to user input received from the user input device, such as a user selecting a "show recent power outage information" from a menu displayed by the processing unit on the presentation device.

For example, in some implementations, the electronic device 101 may be a set top box. The set top box may track one or more power outages as described above. The set top box may be configured to present data regarding one or more tracked power outages via a power outage menu displayed on an associated television in response to user input. As such, a user may utilize a remote control and/or other input/output component to cause the set top box to display the power outage menu on the associated television. The set top box may then retrieve data regarding power outages that have been tracked and present the data regarding these power outages on the associated television. The data may be presented in a list and may be ordered according to date of the respective outage, duration of the respective outage, and so on. The set top box may also be configured to clear data regarding one or more of the recorded outages from the set top box in response to user input, which may be an option of the power outage menu. Thus, the user may be able to select entries in the list corresponding to particular tracked outages and remove entries which are not of interest to the user.

Figure 2:
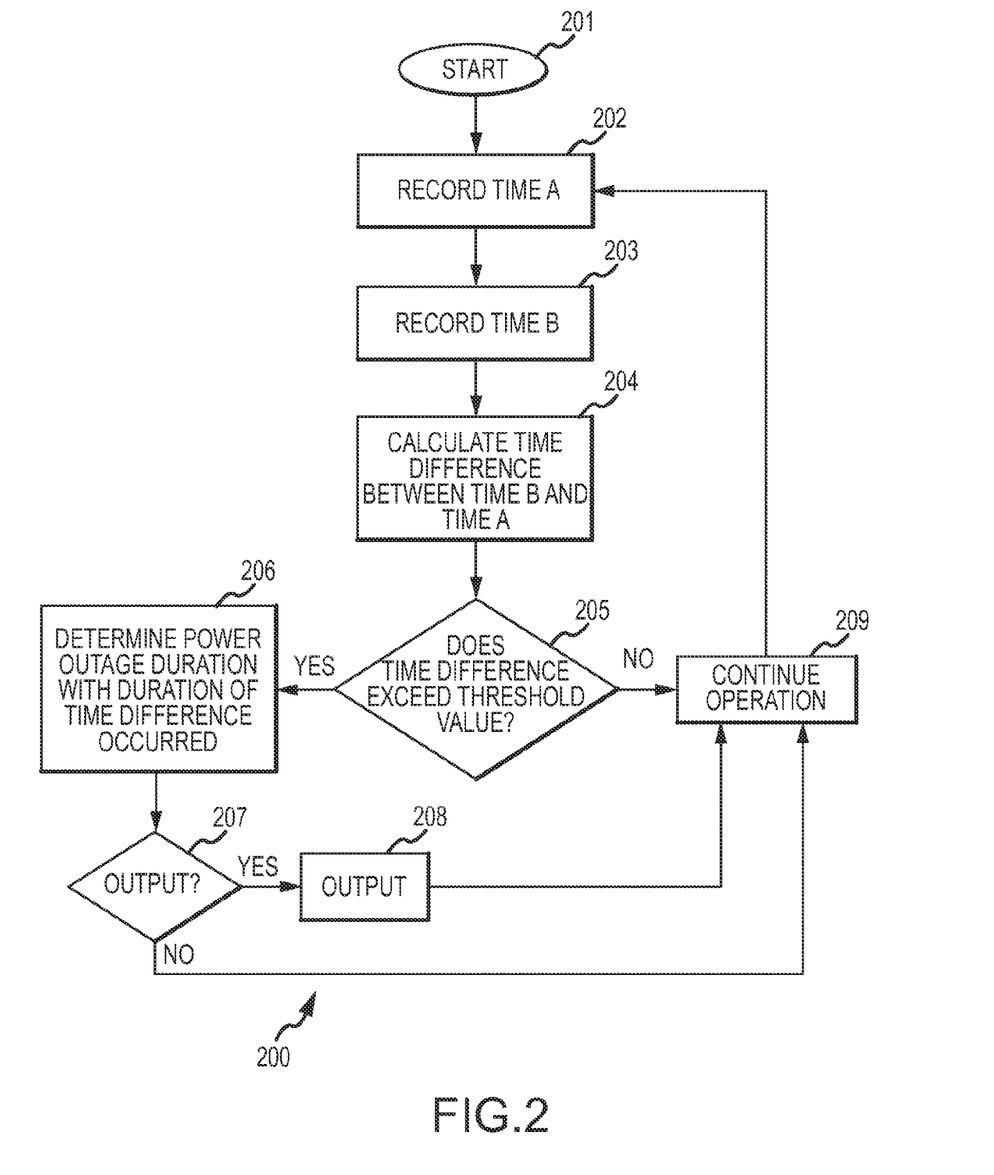
FIG. 2 is a flow chart illustrating a method for tracking power outages utilizing an electronic device. This method may be performed by the system of FIG. 1.

FIG. 2 illustrates a method 200 for tracking power outages utilizing an electronic device. The method 200 may be performed by the electronic device 101 of FIG. 1. The flow begins at block 201 and proceeds to block 202 where the processing unit 103 records a time A in the non-transitory storage medium 104. The flow then proceeds to block 203 where the processing unit records a time B in the non-transitory storage medium.

Although blocks 202 and 203 are described above as recording the time A and the time B without reference to any kind of triggering events, it is understood that in various implementations the electronic device 101 may be configured to record the time A and/or time B in response to one or more triggering events. Such triggering events may include any kind of triggering events such as initial powering up of the electronic device, expiration of one or more associated timers, reboot of the electronic device, and so on. In such implementations, when the electronic device detects such a triggering event that is associated with recording the time A and/or the time B, the electronic device may then record time A and/or time B.

The flow then proceeds to block 204 where the processing unit calculates a time difference between time B and time A. Next, the flow proceeds to block 205 where the processing unit determines whether or not the time difference exceeds the threshold value. If so, the flow proceeds to block 206. Otherwise, the flow returns to block 209 where the electronic device continues operation before the flow returns to block 202.

At block 206, the processing unit 103 determines that the time difference exceeds the threshold value, the processing unit determines that a power outage with a duration corresponding to the time difference has occurred. The flow then proceeds to block 207 where the processing unit determines whether or not to output information regarding the determined power outage.

If not, the flow proceeds to block 209 where the electronic device 101 continues operation. Otherwise, the flow proceeds to block 208 where the processing unit outputs the information regarding the determined power outage via the input/output component 110 and the presentation device 111. The flow then proceeds to block 209 where the electronic device continues operation.

Returning to FIG. 1, in some implementations, the electronic device 101 may include one or more timers that automatically trigger performance of one or more operations at a particular time. In such implementations, after the processing unit 103 determines that a power outage has taken place, the processing unit may examine one or more such timers (which may be stored in the non-transitory storage medium) to ascertain whether one or more operations associated with such timers was not performed due to the power outage. The processing unit may ascertain such by determining a beginning time and an end time for the power outage (which may be based on a current time, the first time, and/or the second time) comparing the beginning and end times for the power outage to one or more times associated with the timers.

In various implementations, if the processing unit ascertains that one or more operations associated with one or more timers was not performed due to a determined power outage, the processing unit may display information regarding the operations that were not performed on the presentation device 111 via the input/output component 110. The processing unit may then perform the operations that were not performed due to the power outage in response to receiving user input from the user input device 112 via the input/output component. In various other implementations, instead of presenting information on the presentation device regarding one or more operations that were not performed due to the power outage, the processing unit may merely perform the operations at or after the second time.

For example, the electronic device 101 may be a content receiver (such as a television receiver, a set top box, a digital video recorder, and so on) which receives content from a content provider (such as a television programming provider, and on-demand movie provider, a pay-per-view content provider, and so on) via a communication link (such as a coaxial cable connection, a satellite connection, a wired or wireless Internet connection, and so on) for storage in the non-transitory storage medium 104 and/or presentation on the presentation device 111. As such, the content receiver may include one or more timers for automatically recording one or more instances of content.

When the content receiver determines that a power outage occurred, the content receiver may ascertain whether automatic recording of content corresponding to one or more timers was not performed due to the power outage. If so, the content receiver may display information regarding the automatic recording that was not performed and may then record the unperformed recording upon receipt of user input. Alternatively, when the content receiver ascertains that the automatic recording was not performed, the content receiver may record the content at that time.

Figure 3:
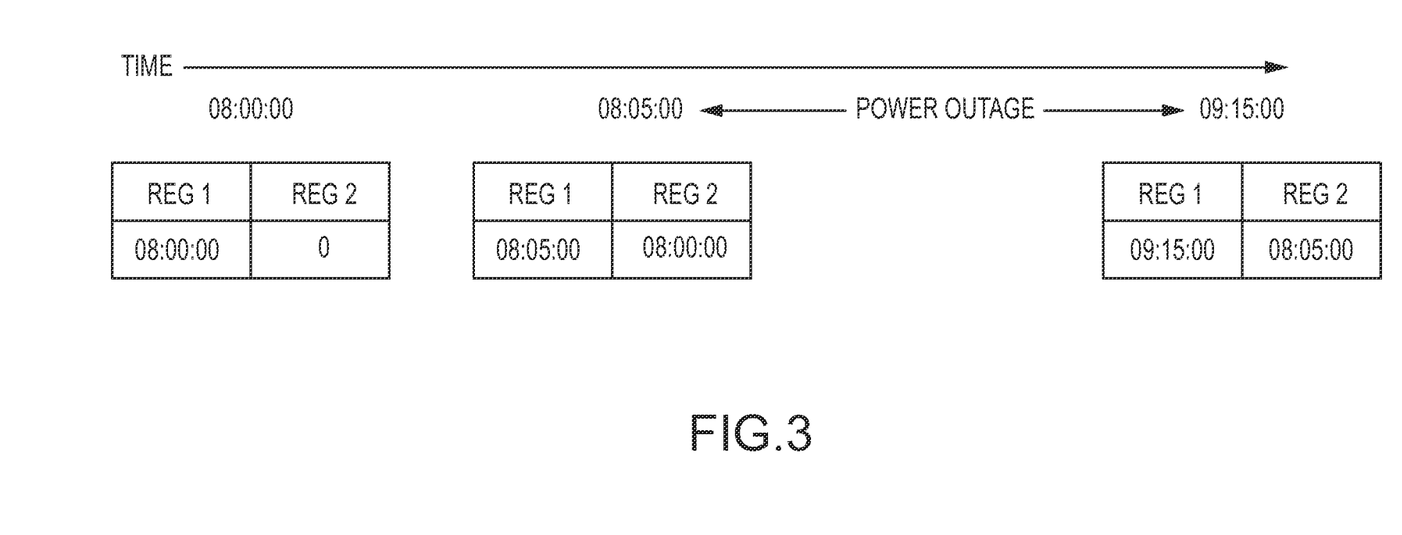
FIG. 3 is a diagram illustrating state changes over time in a first example electronic device that is tracking power outages.

FIG. 3 illustrates state changes over time in a first example electronic device that is tracking power outages. The electronic device in this example may be the electronic device 101 of system 100. In this example, the electronic device includes two nonvolatile registers, Reg 1 and Reg 2, which the electronic device utilizes to keep track of the first and the second times. Further in this example, at an initial electronic device operating time, the electronic device records a current time in Reg 1. Subsequently, after every subsequent fixed interval of electronic device operating time, the electronic device moves the time stored in Reg 1 to Reg 2, records a new current time in Reg 1, and compares the difference between the two registers against a threshold value of ten minutes to determine if a power outage occurred.

As illustrated by the timeline, the electronic device begins operation and records a time of 08:00:00 in Reg 1. After a fixed interval of electronic device operating time, the electronic device transfers the time of 08:00:00 from Reg 1 to Reg 2 and records a new current time of 08:05:00 in Reg 1. As the difference between the times stored in Reg 1 and Reg 2 is less than the threshold value of ten minutes, the electronic device determines that a power outage has not occurred.

However, between 08:05:00 and 09:15:00, a power outage occurs. During the power outage in this example, the electronic device does not operate. Once the power outage is over in this example, the electronic device continues operation until the fixed interval of electronic device operating time finishes elapsing. The electronic device then moves the time stored in Reg 1 to Reg 2, records the current time of 09:15:00 to Reg 1, and compares the difference between the two registers. As the difference is greater than ten minutes, the electronic device determines that a power outage of a duration of approximately one hour and ten minutes has occurred. The electronic device may then automatically present a notification regarding the power outage to a user of the electronic device, provide information regarding the power outage upon user request, and so on.

Figure 4:
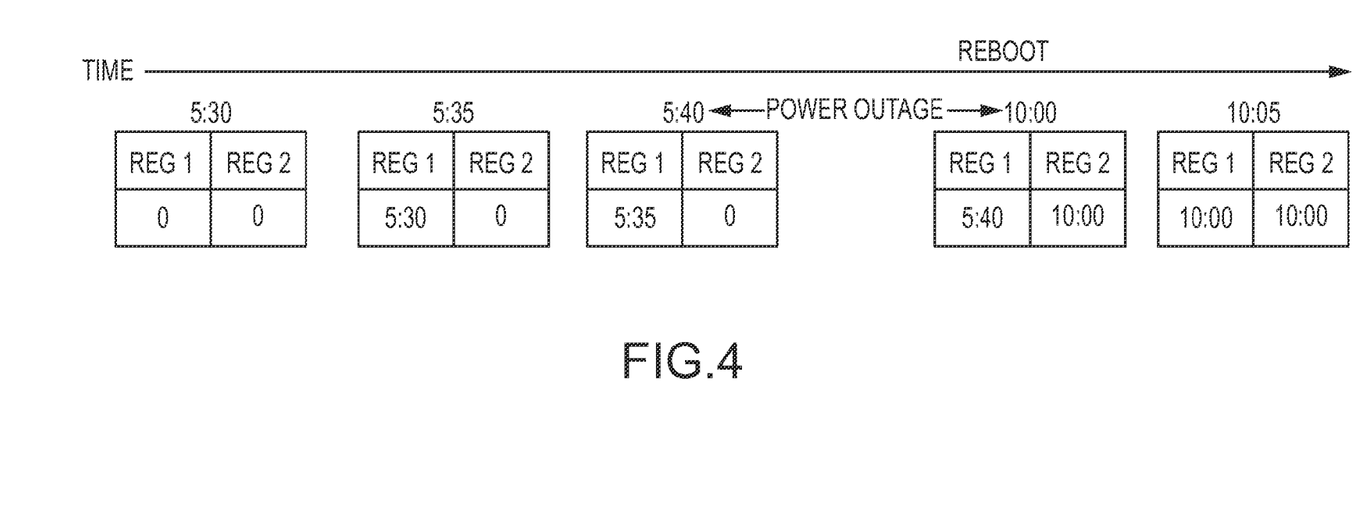
FIG. 4 is a diagram illustrating state changes over time in a second example electronic device that is tracking power outages.

FIG. 4 illustrates state changes over time in a second example electronic device that is tracking power outages. The electronic device in this example may be the electronic device 101 of system 100. In this example, the electronic device includes two nonvolatile registers, Reg 1 and Reg 2, which the electronic device utilizes to keep track of the first and the second times. Further in this example, after every fixed interval of electronic device operating time, the electronic device stores a time from the beginning of the fixed interval in Reg 1. Additionally, if the electronic device reboots instead of merely powering on (which may be the initial time the electronic device is powered on, any time the electronic device is powered on after a user had powers off the electronic device, and so on), the electronic device may record a reboot time in Reg 2, calculate a difference between Reg 1 and Reg 2, and determine a power outage has occurred if the difference is greater than a threshold time value of fifteen minutes.

As illustrated by the timeline, the electronic device initially begins operation at a time of 5:30. After a first fixed interval of electronic device operating time, the electronic device records a time of 5:30 in Reg 1. After a second fixed interval of electronic device operating time, the electronic device records a time of 5:35 in Reg 1. As a reboot has not occurred, the electronic device determines that a power outage has not occurred.

However, between 5:40 and 10:00, a power outage occurs. During the power outage in this example, the electronic device does not operate. Once the power outage is over in this example, the electronic device continues operation until the fixed interval of electronic device operating time finishes elapsing. The electronic device then records a time of 5:40 in Reg 1 and a reboot time of 10:00 in Reg 2. Because a reboot occurred, the electronic device compares the difference between Reg 2 and Reg 1 against the threshold value of fifteen minutes. As the difference is greater than fifteen minutes, the electronic device determines that a power outage of a duration of approximately four hours and twenty minutes has occurred. The electronic device may then automatically present a notification regarding the power outage to a user of the electronic device, provide information regarding the power outage upon user request, and so on.

Figure 5:
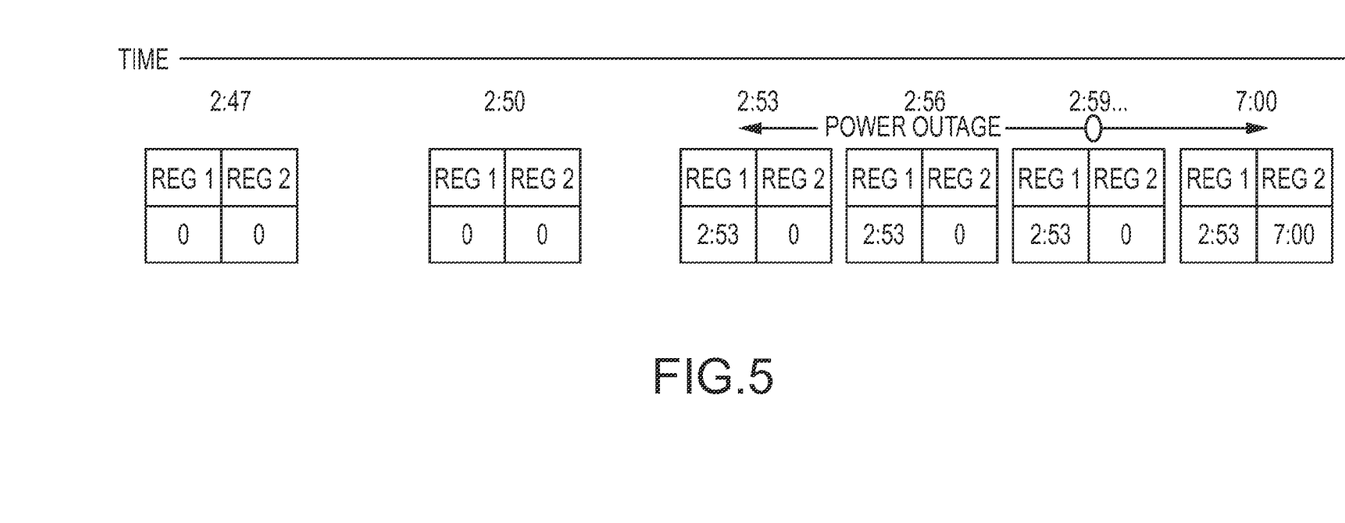
FIG. 5 is a diagram illustrating state changes over time in a third example electronic device that is tracking power outages.

FIG. 5 illustrates state changes over time in a third example electronic device that is tracking power outages. The electronic device in this example may be the electronic device 101 of system 100. In this example, the electronic device includes two nonvolatile registers, Reg 1 and Reg 2, which the electronic device utilizes to keep track of the first and the second times. Further in this example, the electronic device is capable of at least partially operating utilizing an internal battery and when the electronic device detects that it loses connection to an AC power source, the electronic device stores an AC power loss time from an internal clock in Reg 1. When the electronic device detects that it resumes connection to the AC power source, the electronic device records an AC power resume time from the internal clock in Reg 2 and determines whether a power outage occurred by comparing the difference between Reg 2 and Reg 1 to a threshold value of thirty seconds.

As illustrated by the timeline, the electronic device is operating at a time of 2:47. Until a time of 2:53, the electronic device has recorded no values in Reg 1 or Reg 2 because the electronic device has not detected a loss of connection to an AC power source and/or a resumption of a connection to an AC power source after losing such a connection. However, between 2:53 and 7:00, a power outage occurs. During the power outage in this example, the internal clock of the electronic device continues to operate utilizing power from an internal battery. When the electronic device detects that the connection to the AC power source is lost at 2:53, the electronic device records an AC power loss time of 2:53 in Reg 1. When the electronic device detects that the connection to the AC power source is resumed at 7:00, the electronic device records an AC power resume time of 7:00 in Reg 2. As the difference is greater than thirty seconds, the electronic device determines that a power outage of a duration of approximately four hours and seven minutes has occurred. The electronic device may then automatically present a notification regarding the power outage to a user of the electronic device, provide information regarding the power outage upon user request, and so on.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

The invention claimed is:

1. A method for tracking power outages utilizing an electronic device, the method comprising:
recording a first time at a first nonvolatile register of an electronic device wherein the electronic device is connected to an alternating current electric power source at the first time, and wherein the first time comprises the elapsed time of at least one thousand clock cycles;
recording a second time utilizing the electronic device wherein the electronic device is connected to the alternating current electric power source at the second time;
determining that the first time is other than null value, wherein a null value time comprises a time corresponding to a user-initiated power-off event;
calculating a time difference between the second time and the first time;
verifying that the time difference is greater than a non-zero time threshold value; and
determining, utilizing the electronic device, a power outage with a duration corresponding to the time difference.

2. The method of claim 1, wherein said operation of recording the second time is performed after a fixed interval of electronic device operation passes subsequent to said operation of recording the first time.

3. The method of claim 1, wherein said operation of recording the second time is performed upon reboot of the electronic device.

4. The method of claim 1, further comprising monitoring whether or not the electronic device is connected to the alternating current power source wherein said operation of recording the second time is performed when the electronic device is connected to the alternating current power source after not being connected to the alternating current power source.

5. The method of claim 1, wherein the electronic device determines the first time and the second time from at least one of a received time signal, an internal clock, or the internal clock that is periodically synchronized with the received time signal.

6. The method of claim 1, further comprising transmitting the duration of the determined power outage to a presentation device.

7. The method of claim 6, wherein said operation of transmitting the duration of the determined power outage to a presentation device further comprises receiving a request from a user to present the duration of the determined power outage.

8. The method of claim 1, wherein the electronic device is a content receiver with at least one timer set to trigger the content receiver to perform at least one operation at a time during the duration of the determined power outage and further comprising transmitting a message to a presentation device indicating that the at least one operation was not performed.

9. The method of claim 8, wherein the at least one operation comprises automatic recording of television content.

10. The method of claim 1, wherein the electronic device is a content receiver with at least one timer set to trigger the content receiver to perform at least one operation at a time during the duration of the determined power outage and further comprising performing the at least one operation subsequent to the second time.

11. The method of claim 1, further comprising determining intended absence of power between the first time and the second time when the first time is null value.

12. An electronic device for tracking power outages, comprising:
at least one processing unit;
a receiver communicably coupled to the at least one processing unit;
an internal clock communicably coupled to the at least one processing unit, wherein the internal clock is periodically synchronized with a time signal received by the receiver from a source external the electronic device over one of a terrestrial communication network and a non-terrestrial communication network;
at least one non-transitory storage medium, communicably coupled to the at least one processing unit; and
a power connection, communicably coupled to the at least one processing unit, that receives power from an alternating current electric power source;
wherein the at least one processing unit:
records from the internal clock a first time in the at least one non-transitory storage medium while the power connection is receiving power from the alternating current electric power source,
records from the internal clock a second time in the at least one non-transitory storage medium while the power connection is receiving power from the alternating current electric power source,
determines that the first time is other than a null value, wherein a null value time comprises a time corresponding to a user-initiated power-off event;
calculates a time difference by subtracting the second time from the first time,
verifies that the time difference is greater than a non-zero time threshold value, and
determines a power outage with a duration corresponding to the time difference.

13. The electronic device of claim 12, wherein the at least one processing unit records the second time after a fixed interval of electronic device operation passes after the at least one processing unit records the first time.

14. The electronic device of claim 12, wherein the at least one processing unit records the second time upon reboot of the electronic device.

15. The electronic device of claim 12, wherein the at least one processing unit monitors whether or not the power connection is receiving power from the alternating current electric power source and records the second time when the power connection is receiving power from the alternating current electric power source after not receiving power from the alternating current electric power source.

16. The electronic device of claim 12, further comprising at least one output component communicably coupled to the at least one processing unit wherein the at least one processing unit transmits the duration of the determined power outage to a presentation device via the at least one communication component.

17. The electronic device of claim 16, further comprising a user input component communicably coupled to the at least one processing unit wherein the at least one processing unit transmits the duration of the determined power outage to the presentation device via the at least one communication component in response to receiving a request from a user via the user input component.

18. The electronic device of claim 12, further comprising at least one output component communicably coupled to the at least one processing unit wherein the electronic device comprises a content receiver with at least one timer set to trigger the content receiver to perform at least one operation at a time during the duration of the determined power outage and the at least one processing unit transmits a message that the at least one operation was not performed to a presentation device via the at least one output component.

19. The electronic device of claim 12, wherein the at least one operation comprises automatic television content recording.

20. The electronic device of claim 12, further comprising at least one output component communicably coupled to the at least one processing unit wherein the electronic device comprises a content receiver with at least one timer set to trigger the content receiver to perform at least one operation at a time during the duration of the determined power outage and the at least one processing unit performs the at least one operation subsequent to the second time.

* * * * *